United States Patent
Yang et al.

(10) Patent No.: US 10,818,733 B2
(45) Date of Patent: Oct. 27, 2020

(54) ORGANIC LIGHT-EMITTING DIODE TOUCH DISPLAY SUBSTRATE, ORGANIC LIGHT-EMITTING DIODE TOUCH DISPLAY PANEL, DISPLAY DEVICE AND CONTROL METHOD THEREOF

(71) Applicant: BOE TECHNOLOGY GROUP CO., LTD., Beijing (CN)

(72) Inventors: Shengji Yang, Beijing (CN); Xue Dong, Beijing (CN); Jing Lv, Beijing (CN); Xiaochuan Chen, Beijing (CN); Can Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/735,849

(22) PCT Filed: Jun. 8, 2017

(86) PCT No.: PCT/CN2017/087588
§ 371 (c)(1),
(2) Date: Dec. 12, 2017

(87) PCT Pub. No.: WO2018/076704
PCT Pub. Date: May 3, 2018

(65) Prior Publication Data
US 2020/0035756 A1    Jan. 30, 2020

(30) Foreign Application Priority Data
Oct. 31, 2016    (CN) .......................... 2016 1 0967503

(51) Int. Cl.
*G06F 3/044* (2006.01)
*H01L 27/32* (2006.01)
(Continued)

(52) U.S. Cl.
CPC ............ *H01L 27/323* (2013.01); *G06F 3/044* (2013.01); *G06F 3/0412* (2013.01);
(Continued)

(58) Field of Classification Search
CPC .......... G06F 3/044; G06F 3/045; G06F 3/047; G06F 3/0412
See application file for complete search history.

(56) References Cited

U.S. PATENT DOCUMENTS

| 2014/0028334 A1* | 1/2014 | Liu .................... G06F 3/044 324/679 |
| 2015/0185902 A1 | 7/2015 | Liu et al. |

(Continued)

FOREIGN PATENT DOCUMENTS

| CN | 103926729 A | 7/2014 |
| CN | 104020891 A | 9/2014 |

(Continued)

OTHER PUBLICATIONS

International Search Report and Written Opinion for Application No. PCT/CN2017/087588, dated Sep. 13, 2017, 9 Pages.
(Continued)

*Primary Examiner* — William Boddie
(74) *Attorney, Agent, or Firm* — Brooks Kushman P.C.

(57) ABSTRACT

An OLED touch display substrate, an OLED touch display panel, a display device and a control method thereof are provided. The OLED touch display substrate includes an anode, a cathode and a functional layer arranged on a base substrate. The cathode includes sub-cathodes, a time period for displaying one image frame of the OLED touch display substrate includes a display time period and a touch time period, and the sub-cathodes further serve as touch electrodes. The touch display substrate further includes touch signal lines electrically connected to the touch electrodes.
(Continued)

Within the display time period, a common voltage signal is applied to each touch electrode via the respective touch signal line. Within the touch time period, a touch scanning signal is applied to each touch electrode via the respective touch signal line, and it is detected whether or not a self-capacitance of the touch electrode changes.

20 Claims, 5 Drawing Sheets

(51) Int. Cl.
*G06F 3/041* (2006.01)
*H01L 51/50* (2006.01)
*H01L 51/52* (2006.01)

(52) U.S. Cl.
CPC ...... *H01L 51/5056* (2013.01); *H01L 51/5072* (2013.01); *H01L 51/5221* (2013.01)

(56) References Cited

U.S. PATENT DOCUMENTS

| | | |
|---|---|---|
| 2015/0220174 A1 | 8/2015 | Mu et al. |
| 2015/0309631 A1* | 10/2015 | Wang .................. G06F 1/16 345/174 |
| 2016/0117031 A1* | 4/2016 | Han .................. G06F 3/0412 345/174 |
| 2016/0239150 A1* | 8/2016 | Lee .................. G06F 3/017 |
| 2016/0246408 A1 | 8/2016 | Wang et al. |
| 2016/0293631 A1 | 10/2016 | Sun et al. |
| 2016/0328058 A1* | 11/2016 | Peng .................. G06F 3/0412 |
| 2017/0090644 A1* | 3/2017 | Yao .................. G06F 3/0416 |
| 2017/0108971 A1 | 4/2017 | Yang et al. |
| 2017/0269762 A1 | 9/2017 | Xu et al. |
| 2018/0088725 A1 | 3/2018 | Yang et al. |
| 2018/0356922 A1* | 12/2018 | Liu .................. H01L 51/5221 |

FOREIGN PATENT DOCUMENTS

| | | |
|---|---|---|
| CN | 104699349 A | 6/2015 |
| CN | 104850268 A | 8/2015 |
| CN | 104881170 A | 9/2015 |
| CN | 104991683 A | 10/2015 |
| CN | 105278748 A | 1/2016 |
| CN | 105518863 A | 4/2016 |
| CN | 106354339 A | 2/2017 |

OTHER PUBLICATIONS

First Office Action for Chinese Application No. 201610967503.5, dated Aug. 27, 2018, 9 Pages.

\* cited by examiner

ORGANIC LIGHT-EMITTING DIODE TOUCH DISPLAY SUBSTRATE, ORGANIC LIGHT-EMITTING DIODE TOUCH DISPLAY PANEL, DISPLAY DEVICE AND CONTROL METHOD THEREOF

CROSS-REFERENCE TO RELATED APPLICATIONS

This application is the U.S. national phase of PCT Application No. PCT/CN2017/087588 filed on Jun. 8, 2017, which claims priority to Chinese Patent Application No. 201610967503.5 filed on Oct. 31, 2016, which are incorporated herein by reference in their entireties.

TECHNICAL FIELD

The present disclosure relates to the field of touch display technology, in particular to an organic light-emitting diode (OLED) touch display substrate, an OLED touch display panel, a display device and a control method thereof.

BACKGROUND

Along with the rapid development of the display technology, the semiconductor element technique, in which an OLED is used as a core of a display device, has achieved great improvement. For a display device in the related art, the OLED is a current-type light-emitting element, and it has been widely used for high-performance display due to such advantages as self-luminescence, rapid response, wide-viewing angle and being capable of formed on a flexible substrate.

Along with the development of the portable electronic display device, a touch display device is capable of providing a new human-machine interface, so as to improve the user experience. In the related art, for an OLED touch display device, usually an OLED display panel and an OLED touch panel are manufactured separately and then combined together. The OLED touch display device may generally include an OLED substrate, an OLED cover plate, a touch panel substrate and a touch screen cover plate. However, such OLED touch display device has relatively low light transmittance as well as a relatively large thickness.

SUMMARY

An object of the present disclosure is to provide an OLED touch display substrate, an OLED touch display panel, a display device and a control method thereof, so as to provide the display device without attaching an add-on touch panel onto an OLED display panel, thereby to provide the OLED touch display substrate, the OLED touch display pane and the display device with a simple structure, a small thickness and high light transmittance.

In one aspect, the present disclosure provides in some embodiments an OLED touch display substrate, including an anode and a cathode arranged on a base substrate; and a functional layer arranged between the anode and the cathode, wherein the cathode includes a plurality of sub-cathodes insulated from each other, a time period for displaying one image frame of the OLED touch display substrate includes a display time period and a touch time period, and the plurality of sub-cathodes further serves as a plurality of touch electrodes within the touch time period.

In a possible embodiment of the present disclosure, the OLED touch display substrate further includes a plurality of touch signal lines electrically connected to the touch electrodes respectively.

In a possible embodiment of the present disclosure, the cathode is formed as an entire layer; the OLED touch display substrate further includes a pattern of a spacer formed on the cathode; and the pattern of the spacer is made of a negative photosensitive material, and configured to divide the cathode into the plurality of sub-cathodes insulated from each other.

In a possible embodiment of the present disclosure, the touch signal lines and the sub-cathodes are arranged at an identical layer. The cathode includes a plurality of rows of sub-cathodes, the sub-cathodes in each of the rows are separated from each other, sizes of the sub-cathodes gradually decrease in a row direction from a position adjacent to a center of the OLED touch display substrate to a position away from the center of the OLED touch display substrate, and each of the touch signal lines extends from a respective sub-cathode in a direction parallel to the row direction; or the cathode includes a plurality of columns of sub-cathodes, the sub-cathodes in each of the columns are separated from each other, sizes of the sub-cathodes gradually decrease in a column direction from the position adjacent to the center of the OLED touch display substrate to the position away from the center of the OLED touch display substrate, and each of the touch signal lines extends from a respective sub-cathode in a direction parallel to the column direction.

In a possible embodiment of the present disclosure, an insulation layer is arranged between the touch signal lines and the sub-cathodes, and each of the sub-cathodes is electrically connected to the respective touch signal line through a via-hole in the insulation layer.

In a possible embodiment of the present disclosure, the cathode includes the plurality of sub-cathodes arranged in an array form, and the plurality of sub-cathodes is of an identical shape and an identical size.

In a possible embodiment of the present disclosure, the cathode includes a plurality of groups of sub-cathodes. Each group of sub-cathodes include a plurality of pairs of sub-cathodes arranged in a row, each pair of sub-cathodes include two sub-cathodes of right triangle shapes with their hypotenuses opposite to each other, each of the sub-cathodes includes a first leg parallel to a column direction, and the touch signal lines are connected to the first legs of the sub-cathodes in each of the groups and arranged at a left side and a right side of the sub-cathodes in each of the groups; or each group of sub-cathodes include a plurality of pairs of sub-cathodes arranged in a column, each pair of sub-cathodes include two sub-cathodes of right triangle shapes with their hypotenuses opposite to each other, each of the sub-cathodes includes a second leg parallel to a row direction, and the touch signal lines are connected to the second legs of the sub-cathodes in each of the groups and arranged at an upper side and a lower side of each of the groups.

In a possible embodiment of the present disclosure, the touch signal lines and gate lines and gate electrodes of the OLED touch display substrate are arranged at an identical layer; or the touch signal lines and source electrodes, drain electrodes and data lines of the OLED touch display substrate are arranged at the identical layer.

In a possible embodiment of the present disclosure, the base substrate is made of monocrystalline silicon or polycrystalline silicon; the OLED touch display substrate further includes an array circuit layer formed on the base substrate; and the array circuit layer includes a plurality of thin film transistors (TFTs), and active regions of the TFTs are arranged within the base substrate.

In a possible embodiment of the present disclosure, within the display time period of the time period for displaying one image frame, the functional layer is capable of emitting white light under the effect of the cathode and the anode.

In a possible embodiment of the present disclosure, the functional layer includes a hole injection layer, a hole transport layer, an organic light-emitting layer, an electron transport layer and an electron injection layer sequentially arranged at a side of the anode adjacent to the cathode.

In another aspect, the present disclosure provides in some embodiments an OLED touch display panel including the above-mentioned OLED touch display substrate and a packaging cover plate arranged opposite to the OLED touch display substrate to form a cell.

In a possible embodiment of the present disclosure, within the display time period of the time period for displaying one image frame, the functional layer is capable of emitting white light under the effect of the cathode and the anode; and a color filter is arranged on the packaging cover plate.

In yet another aspect, the present disclosure provides in some embodiments a display device including the above-mentioned OLED touch display panel.

In still yet another aspect, the present disclosure provides in some embodiments a method for controlling the above-mentioned display device, including steps of: within the display time period of the time period for displaying one image frame, applying a common voltage signal to the cathode and applying a data signal to the anode; and within the touch time period of the time period for displaying one image frame, applying a touch scanning signal to touch signal lines and detecting whether or not a self-capacitance of each of the touch electrodes changes.

In a possible embodiment of the present disclosure, the touch scanning signal is a square wave signal; and the touch scanning signal is superimposed onto a signal applied to each of the signal lines of the OLED touch display substrate while applying the touch scanning signal to the touch signal lines.

BRIEF DESCRIPTION OF THE DRAWINGS

In order to illustrate the technical solutions of the present disclosure in a clearer manner, the drawings desired for the present disclosure will be described hereinafter briefly. Obviously, the following drawings merely relate to some embodiments of the present disclosure, and based on these drawings, a person skilled in the art may obtain the other drawings without any creative effort. Shapes and sizes of the members in the drawings are for illustrative purposes only, but shall not be used to reflect any actual scale.

REFERENCE SIGN LIST

Figure 1:
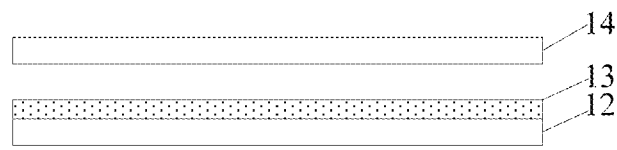
FIG. 1 is a schematic view showing a OLED touch display device in the related art.

11 OLED display substrate
12 packaging cover plate
13 touch electrode
14 touch screen cover plate
1 base substrate
2 packaging cover plate
6 anode
7 functional layer
8 cathode
9 sub-cathode
10 touch signal line

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

As shown in FIG. 1, for an OLED touch display device in the related art, usually an OLED display screen and a touch screen are manufactured separately, and then assembled together. The OLED touch display device may usually include an OLED display substrate 11, a packaging cover plate 12 and a touch screen cover plate 14. A touch electrode 13 may be directly formed on the packaging cover plate 12. However, the OLED touch display device has relatively low light transmittance as well as a relatively large thickness.

An object of the present disclosure provides an OLED touch display substrate, an OLED touch display panel, a display device and a control method thereof, so as to provide the display device without attaching an add-on touch screen onto an OLED display panel, thereby to provide the OLED touch display substrate, the OLED touch display pane and the display device with a simple structure, a small thickness and high light transmittance.

Figure 2:
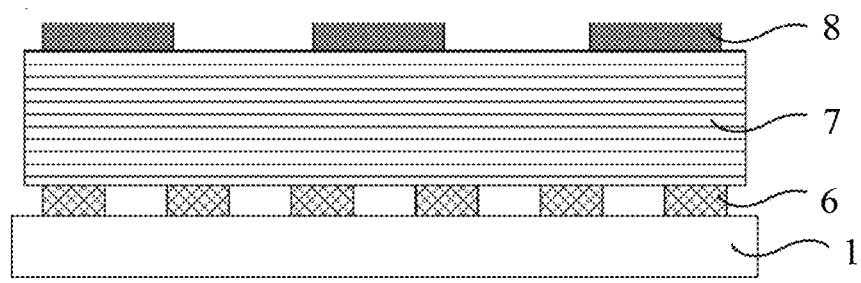
FIG. 2 is a schematic view showing an OLED touch display substrate according to some embodiments of the present disclosure.
Figure 3:
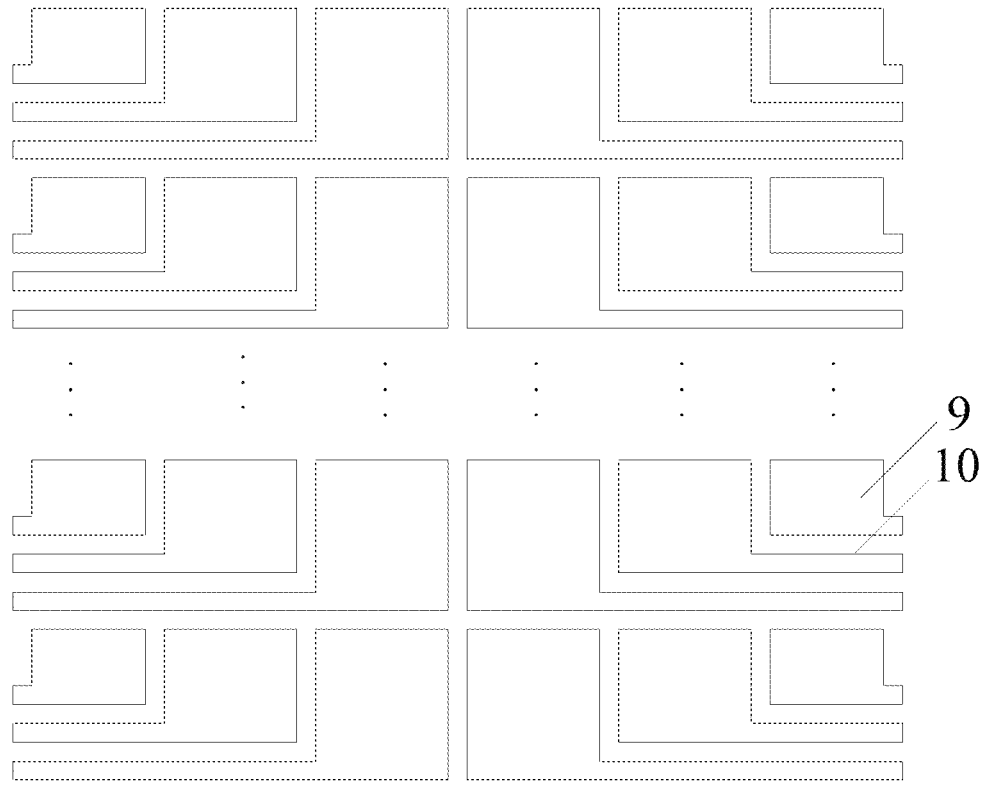
FIGS. 3-5 are schematic views showing the arrangement of sub-cathodes according to some embodiments of the present disclosure.
Figure 4:
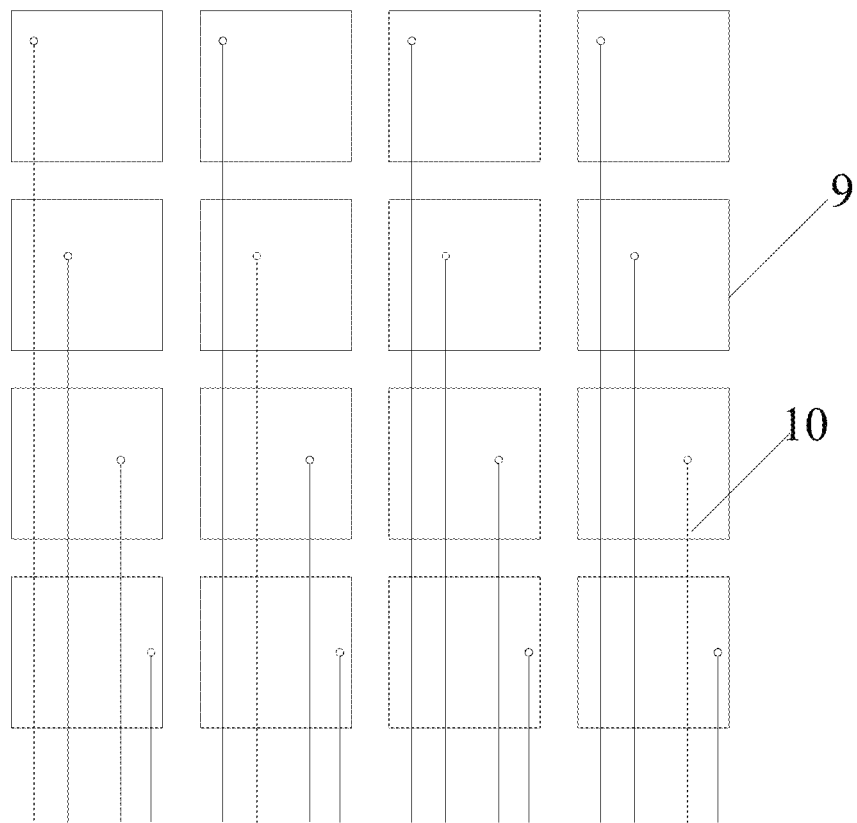
Figure 5:
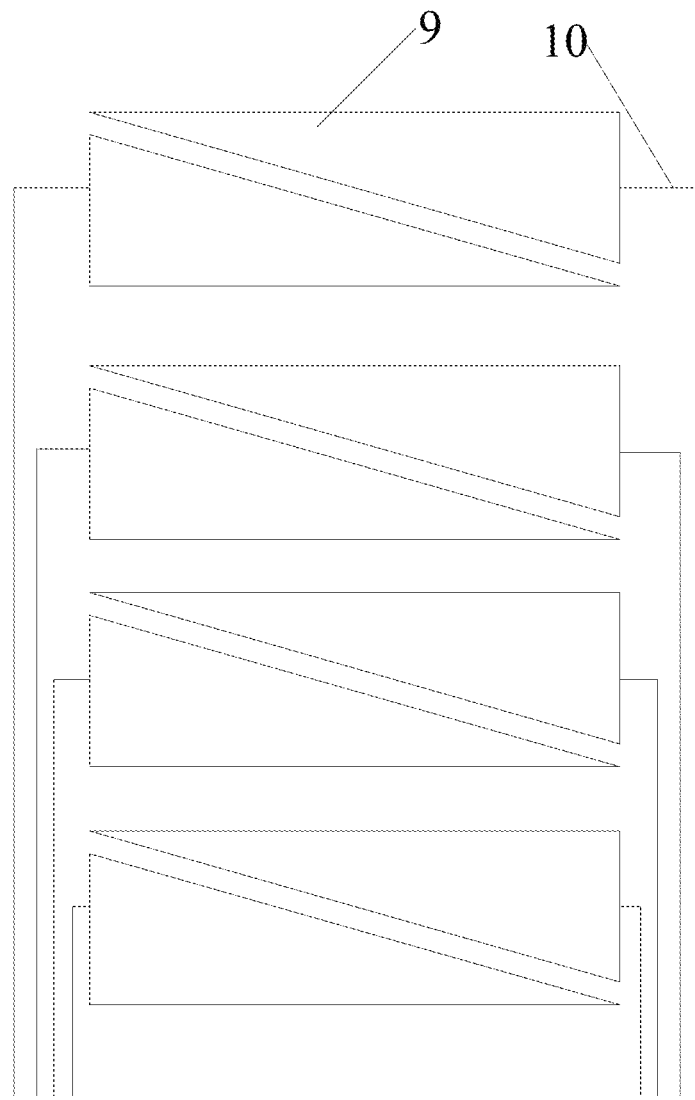

The present disclosure provides in some embodiments an OLED touch display substrate which, as shown in FIG. 2, includes an anode 6 and a cathode 8 arranged on a base substrate 1, and a functional layer 7 arranged between the anode 6 and the cathode 8. As shown in FIGS. 3-5, the cathode 8 includes a plurality of sub-cathodes 9 insulated from each other. The time period for displaying one image frame of the OLED touch display substrate includes a display time period and a touch time period. The plurality of sub-cathodes 9 further serves as a plurality of touch electrodes. The OLED touch display substrate further includes a plurality of touch signal lines 10 electrically connected to the touch electrodes respectively. Within the display time period of the time period for displaying one image frame, a common voltage signal may be applied to the touch electrode via the respective touch signal line. Within the touch time period of the time period for displaying one image frame, a touch scanning signal may be applied to the touch electrode via the respective touch signal line. A touch circuit may detect whether or not a self-capacitance of each touch electrode changes through the respective touch signal line.

Within the time period for displaying one image frame, a common voltage signal may be applied to each touch electrode via the respective touch signal line 10 connected thereto, and within the touch time period of each frame, a touch scanning signal may be applied to each touch electrode via the respective touch signal line connected thereto. A touch circuit may determine whether or not a self-capacitance of the touch electrode changes through the respective touch signal line.

According to the embodiments of the present disclosure, the OLED touch display substrate includes the anode, the cathode and the functional layer arranged between the anode and the cathode. Within the touch time period, the anode further serves as the touch electrodes. In this regard, the time period for displaying each image frame of the OLED touch display substrate may be divided into the display time period and the touch time period. Within the display time period, the common voltage signal is applied to the cathode so as to enable the OLED touch display substrate to display an image. Within the touch time period, the touch scanning signal is applied to the cathode, such that the cathode further serves as the touch electrodes, to acquire a touch position, thereby to perform a touch operation. During the touch display procedure of the OLED touch display substrate, the cathode is capable of serving as the touch electrode, so it is unnecessary to provide the OLED display panel with an add-on touch screen. As compared with an add-on touch display panel, it is able to simplify the structure, reduce the thickness and improve the light transmittance.

To be specific, the cathode 8 may include a plurality of sub-cathodes separated from each other or formed as an entire layer. In the case that the cathode 8 is formed as an entire layer, the touch display substrate further includes a pattern of a spacer formed on the cathode and made of a negative photosensitive material. The pattern of the spacer is formed in such a manner as to divide the cathode into the plurality of sub-cathodes insulation from each other. In this regard, it is unnecessary to form a pattern of the cathode through a specific patterning process. Instead, it is merely necessary to form the cathode as an entire layer, and then divide the cathode into the plurality of sub-cathodes insulated from each other through the pattern of the spacer of electronegativity while forming the pattern of the spacer, i.e., a patterning process may be omitted.

In a possible embodiment of the present disclosure, as shown in FIG. 3, the touch signal lines 10 are arranged at a layer identical to the sub-cathodes. In FIG. 3, the cathode includes a plurality of rows of sub-cathodes 9, the sub-cathodes 9 in each row are separated from each other, sizes of the sub-cathodes are in descending order in a row direction from a position adjacent to a center of the touch display substrate to a position away from the center of the touch display substrate, and each touch signal line extends from a respective sub-cathode in a direction parallel to the row direction.

In a possible embodiment of the present disclosure, the cathode may include a plurality of columns of sub-cathodes, the sub-cathodes in each column are separated from each other, sizes of the sub-cathodes are in descending order in a column direction from the position adjacent to the center of the touch display substrate to the position away from the center of the touch display substrate, and each touch signal line extends from a respective sub-cathode in a direction parallel to the column direction.

In a possible embodiment of the present disclosure, an insulation layer is arranged between the touch signal lines and the sub-cathodes, and each sub-cathode is electrically connected to the respective touch signal line through a via-hole penetrating through the insulation layer. The touch signal lines may be formed using another conductive layer of the touch display substrate. For example, the touch signal lines may be formed using a gate metal layer of the touch display substrate and arranged at a layer identical to gate lines and gate electrodes of the touch display substrate. For another example, the touch signal lines may be formed using a source-drain metal layer of the touch display substrate and arranged at a layer identical to source electrodes, drain electrodes and data lines of the touch display substrate.

To be specific, as shown in FIG. 4, the cathode may include the plurality of sub-cathodes 9 arranged in an array form and having an identical shape and an identical size. Each sub-cathode 9 may be made of a rectangular shape. Further, the sub-cathode 9 may also be of a circular, elliptical, regularly hexagonal or triangular shape, and the shape of the sub-cathode 9 will not be particularly defined herein. In FIG. 4, the touch signal lines 10 connected to the sub-cathodes 9 may extend in an identical direction. In the case that the sub-cathodes 9 have an identical shape and an identical size, it is able to ensure that the sub-cathodes have identical touch sensitivity, thereby to improve the touch sensing uniformity.

In a possible embodiment of the present disclosure, the cathode may include a plurality of groups of sub-cathodes, and FIG. 5 shows one of such groups. The group of sub-cathodes includes a plurality of pairs of sub-cathodes 9 arranged in a row, each pair of sub-cathodes includes two sub-cathodes 9 of right triangle shapes with their hypotenuses opposite to each other, each sub-cathode 9 includes a first leg parallel to the column direction, and the touch signal lines 10 are connected to the first legs of the sub-cathodes in each group and arranged at a left side and a right side of the sub-cathodes in each group.

Further, each group of sub-cathodes may include a plurality of pairs of sub-cathodes arranged in a column, each pair of sub-cathodes include two sub-cathodes of right triangle shapes with their hypotenuses opposite to each other, each sub-cathode includes a second leg parallel to the row direction, and the touch signal lines are connected to the second legs of the sub-cathodes in each group and arranged at upper sides and lower sides of the sub-cathodes in each group.

In the embodiments of the present disclosure, the base substrate 1 may be made of monocrystalline silicon or polycrystalline silicon, the touch display substrate may further include an array circuit layer formed on the base substrate 1, and the array circuit layer includes a plurality of TFTs whose active layers are arranged in the base substrate 1. Because carrier mobility of the monocrystalline silicon may exceed 600 $cm^2$/V-sec, through the formation of the active layer with monocrystalline silicon, it is able to improve the performance of the TFT and reduce a size of the TFT, thereby to increase an aperture ratio of the touch display substrate.

Further, within the display time period of the time period for displaying one image frame, the functional layer is capable of emitting white light under the effect of the cathode and the anode. In the related art, light-emitting layers in different colors are formed on the touch display substrate in a fine metal mask (FMM) evaporation manner. Due to limitation on the precision of the FMM, pixels are formed on the touch display substrate at a low density. However, in the embodiments of the present disclosure, the light-emitting layer for emitting white light is formed on the touch display substrate, and then a color filter is formed on a packaging cover plate accordingly. In this way, it is able to increase the density of the pixels formed on the touch display substrate.

Figure 10:
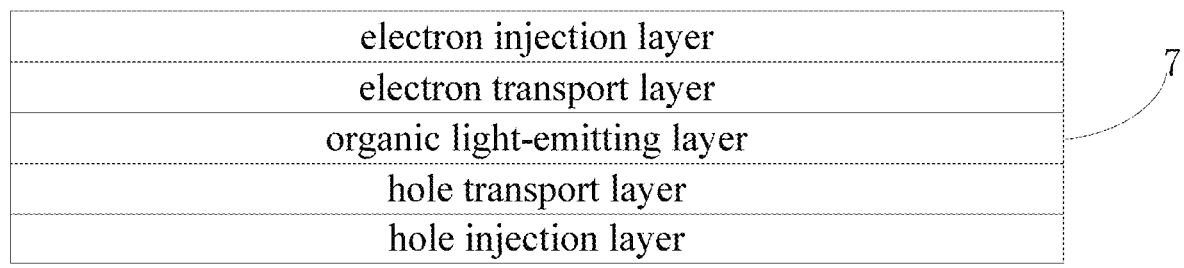
FIG. 10 is a schematic view showing a functional layer of the OLED touch display substrate according to some embodiments of the present disclosure.

To be specific, as shown in FIG. 10, the functional layer 7 includes a hole injection layer, a hole transport layer, an organic light-emitting layer, an electron transport layer and an electron injection layer sequentially arranged at a side of the anode 6 adjacent to the cathode 8.

The present disclosure further provides in some embodiments an OLED touch display panel including the above-mentioned touch display substrate and a packaging cover plate arranged opposite to the touch display substrate to form a cell.

According to the embodiments of the present disclosure, the OLED touch display substrate includes the anode, the cathode and the functional layer arranged between the anode and the cathode. Within the touch time period, the anode further serves as the touch electrodes. In this regard, the time period for displaying each image frame of the OLED touch display substrate may be divided into the display time period and the touch time period. Within the display time period, the common voltage signal is applied to the cathode so as to enable the OLED touch display substrate to display an image. Within the touch time period, the touch scanning signal is applied to the cathode, such that the cathode further serves as the touch electrodes, to acquire a touch position, thereby to perform a touch operation. During the touch display procedure of the OLED display panel, the cathode is capable of serving as the touch electrode, so it is unnecessary to provide the OLED display panel with an add-on touch screen. As compared with an add-on touch display screen, it is able to simplify the structure, reduce the thickness and improve the light transmittance.

Figure 6:
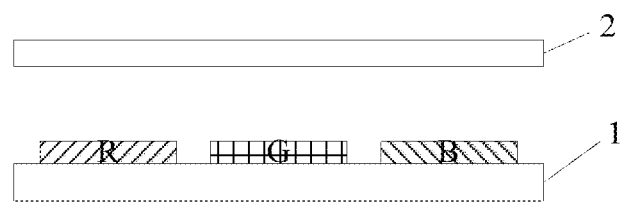
FIG. 6 is a schematic view showing a color filter on a touch display substrate in the related art.

In the related art, as shown in FIG. 6, the light-emitting layers in different colors are formed on the touch display substrate in an FMM evaporation manner. Due to the limitations on the precision of the FMM, the pixels are formed on the touch display substrate at a low density.

Figure 7:
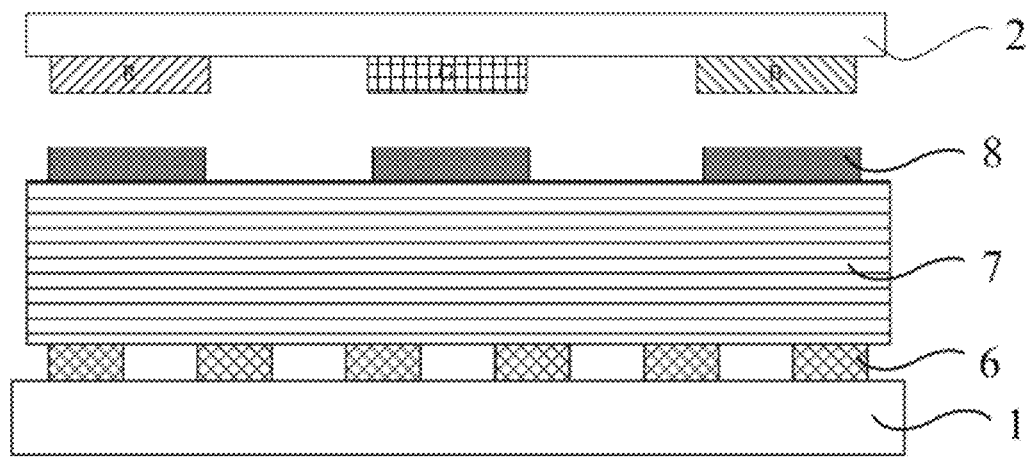
FIG. 7 is a schematic view showing a color filter on a packaging cover plate according to some embodiments of the present disclosure.

In order to solve this problem, in a possible embodiment of the present disclosure, within the display time period of the time period for displaying one image frame, the functional layer is capable of emitting white light under the effect of the cathode and the anode. As shown in FIG. 7, color filters R, G and B are arranged on the packaging cover plate 2, so as to filter the white light from the functional layer. In this way, it is able to prevent the density of the pixels formed on the touch display substrate from being limited by the FMM precision, thereby to increase the density of the pixels on the touch display substrate.

The present disclosure further provides in some embodiments a display device including the above-mentioned OLED touch display panel. The display device may be any product or member having a display function, such as a television, a display, a digital photo frame, a mobile phone or a flat-panel computer. The display device further includes a flexible circuit board, a printed circuit board and a back plate.

According to the embodiments of the present disclosure, the OLED touch display substrate includes the anode, the cathode and the functional layer arranged between the anode and the cathode. Within the touch time period, the anode further serves as the touch electrodes. In this regard, the time period for displaying each image frame of the OLED touch display substrate may be divided into the display time period and the touch time period. Within the display time period, the common voltage signal is applied to the cathode so as to enable the OLED touch display substrate to display an image. Within the touch time period, the touch scanning signal is applied to the cathode, such that the cathode further serves as the touch electrodes, to acquire a touch position, thereby to perform a touch operation. During the touch display procedure of the OLED touch display panel, the cathode is capable of serving as the touch electrode, so it is unnecessary to provide the OLED display panel with an add-on touch screen. As compared with an add-on touch display screen, it is able to simplify the structure, reduce the thickness and improve the light transmittance.

Figure 8:
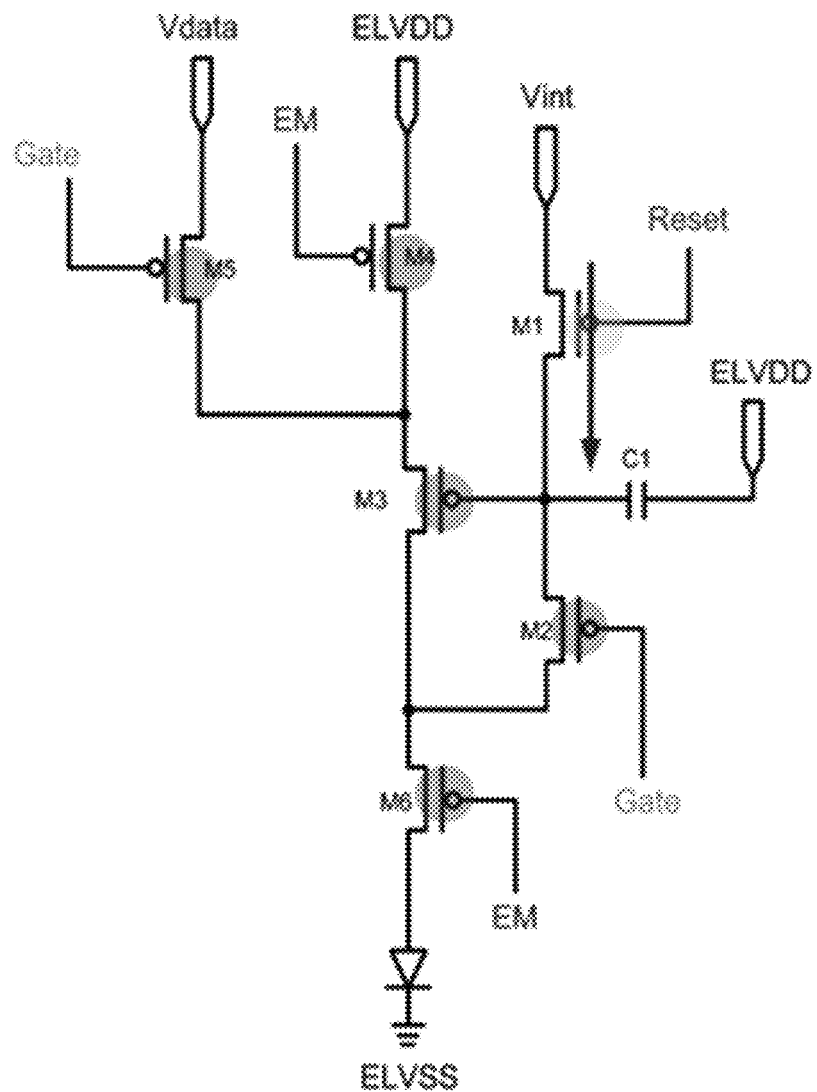
FIG. 8 is a schematic view showing a pixel compensation circuit of the OLED touch display device according to some embodiments of the present disclosure.

Apart from the touch display panel, the display device may further include a pixel compensation circuit as shown in FIG. 8. The pixel compensation circuit includes a data write-in module, a resetting module, a light-emission module and a compensation module. The data write-in module includes a data write-in transistor M5, the resetting module includes a resetting transistor M1, the light-emission module includes transistors M4 and M6, and the compensation module includes a compensation transistor M2. In addition, the pixel compensation circuit further includes a driving transistor M3 and a storage capacitor C1. A gate electrode of M5 is connected to a gate scanning signal output end Gate, a first electrode of M5 is connected to a data signal output end Vdata, and a second electrode of M5 is connected to a first node. A gate electrode of M4 is connected to a light-emission control signal output end EM, a first electrode of M4 is connected to a high level signal output end ELVDD, and a second electrode of M4 is connected to the first node. A gate electrode of M1 is connected to a resetting signal output end Reset, a first electrode of M1 is connected to an initial voltage signal output end Vint, and a second electrode of M1 is connected to a second node. A gate electrode of M3 is connected to the second node, a first electrode of M3 is connected to the first node, and a second electrode of M3 is connected to a third node. A gate electrode of M6 is connected to the light-emission control signal output end EM, a first electrode of M6 is connected to the third node, and a second electrode of M6 is connected to a light-emission diode. A first polar plate of the storage capacitor C1 is connected to the second node, and a second polar plate of the storage capacitor C1 is connected to the high level signal output end ELVDD. A gate electrode of M2 is connected to the gate scanning signal output end Gate, a first electrode of M2 is connected to the second node, and a second electrode of M2 is connected to the third node.

Signals Reset, Gate and EM are sequence signals from a Gate driver On Array (GOA) output unit, signals Vint and ELVDD are received from a flexible printed circuit (FPC), touch signals from a touch electrode (TX) channel are connected to ELVSSs, and a signal Vata is outputted from a source line.

In a possible embodiment of the present disclosure, active layers of TFTs of a data driver circuit, a scanning driver circuit and a display array may be formed in the base substrate made of monocrystalline silicon. Because carrier mobility of monocrystalline silicon may exceed 600 $cm^2$/V-sec, it is able to improve the performance of the TFTs of the data driver circuit and the scanning driver circuit, and reduce the sizes of the TFTs, thereby to prevent the data driver circuit and the scanning driver circuit from occupying a large area of the substrate, and form both of the scanning driver circuit and the data driver circuit on the substrate. In other words, it is able to reduce an area of the portion of the display substrate beyond a display region, increase an area for displaying an image, reduce a size of the display device while ensuring the performance of the circuits and the number of the pixels, and improve a display resolution of the display device.

In addition, for the OLED touch display substrate including the base substrate made of monocrystalline silicon, a complementary metal oxide semiconductor (CMOS) process may be adopted, so it is able to remarkably increase a scanning speed and reduce a load, thereby to improve a touch effect.

The present disclosure further provides in some embodiments a method for controlling the above-mentioned display device, including steps of: within the display time period of the time period for displaying one image frame, applying a common voltage signal to the cathode and applying a data signal to the anode; and within the touch time period of the time period for displaying one image frame, applying a touch scanning signal to the touch signal lines and detecting whether or not a self-capacitance of each touch electrode changes.

According to the embodiments of the present disclosure, the time period for displaying each image frame of the display device includes the display time period and the touch time period. Within the display time period, the common voltage signal is applied to the cathode so as to enable the display device to display an image. Within the touch time period, the touch scanning signal is applied to the cathode, such that the cathode serves as the touch electrodes, to acquire a touch position, thereby to perform a touch operation. During the touch display procedure of the display device, the cathode is capable of serving as the touch electrode, so it is unnecessary to provide the OLED display panel with an add-on touch screen. As compared with an add-on touch display screen, it is able to simplify the structure, reduce the thickness and improve the light transmittance.

Figure 9:
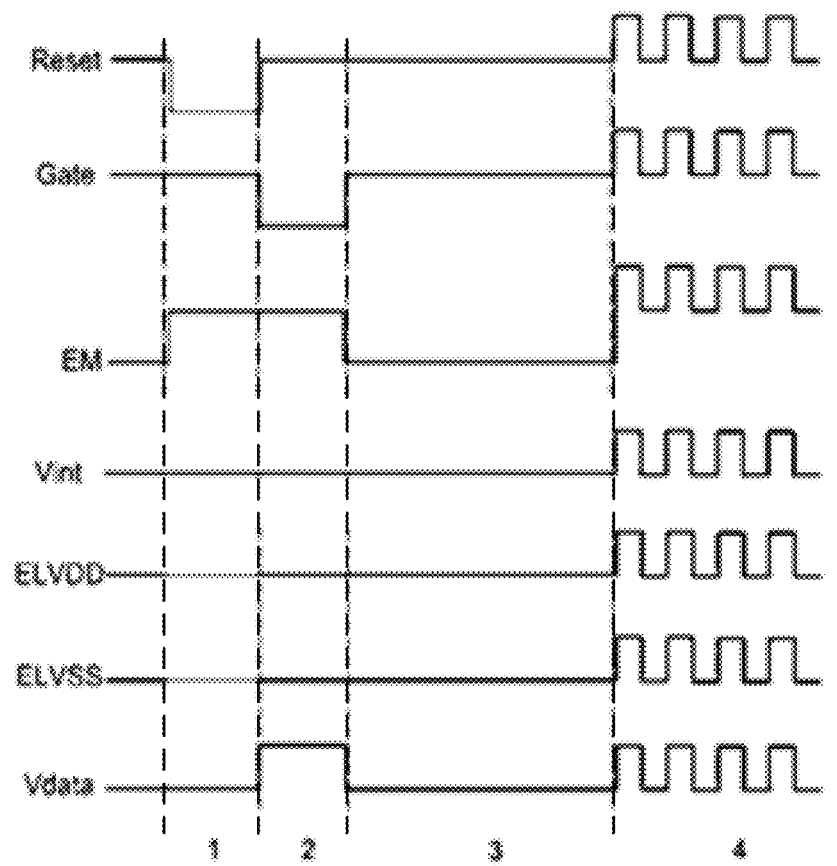
FIG. 9 is a sequence diagram of the pixel compensation circuit in FIG. 8.

Further, as shown in FIG. 9, the touch scanning signal is a square wave signal. In the case that the touch scanning signal is applied to the touch signal line within the touch time period (i.e., a fourth time period), signals applied to all the signal lines of the touch display substrate are modulated synchronously, and the touch scanning signal is superimposed onto the signals applied to the other signal lines of the touch display substrate. In other words, during the touch procedure, the square wave signal may be applied to the other signal lines apart from the touch electrode. In this way, there may be no voltage difference between the touch electrode and a metal electrode therebelow during the touch procedure, and thereby there may exist no capacitance. At this time, even in the case that the touch display panel is touched by a very small portion of a finger, this touch operation may still be detected by the touch display panel, i.e., it is able to improve the touch sensitivity.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An organic light-emitting diode (OLED) touch display substrate, comprising:
    an anode and a cathode arranged on a base substrate;
    a functional layer arranged between the anode and the cathode; and
    a plurality of touch signal lines electrically connected to the touch electrodes respectively,
    wherein the cathode comprises a plurality of sub-cathodes insulated from each other, a time period for displaying one image frame of the OLED touch display substrate comprises a display time period and a touch time period, and the plurality of sub-cathodes further serves as a plurality of touch electrodes within the touch time period,
    the touch signal lines and the sub-cathodes are arranged at an identical layer,
    the cathode comprises a plurality of rows of sub-cathodes, the sub-cathodes in each of the rows are separated from each other, sizes of the sub-cathodes are in descending order in a row direction from a position adjacent to a center of the OLED touch display substrate to a position away from the center of the OLED touch display substrate, and each of the touch signal lines extends from a respective sub-cathode in a direction parallel to the row direction; or
    the cathode comprises a plurality of columns of sub-cathodes, the sub-cathodes in each of the columns are separated from each other, sizes of the sub-cathodes are in descending order in a column direction from the position adjacent to the center of the OLED touch display substrate to a position away from the center of the OLED touch display substrate, and each of the touch signal lines extends from the respective sub-cathode in a direction parallel to the column direction.

2. The OLED touch display substrate according to claim 1, wherein
    the base substrate is made of monocrystalline silicon or polycrystalline silicon;
    the OLED touch display substrate further comprises an array circuit layer formed on the base substrate; and
    the array circuit layer comprises a plurality of thin film transistors (TFTs), and active regions of the TFTs are arranged within the base substrate.

3. The OLED touch display substrate according to claim 1, wherein within the display time period of the time period for displaying one image frame, the functional layer is capable of emitting white light under the effect of the cathode and the anode.

4. The OLED touch display substrate according to claim 1, wherein the functional layer comprises a hole injection layer, a hole transport layer, an organic light-emitting layer, an electron transport layer and an electron injection layer sequentially arranged at a side of the anode adjacent to the cathode.

5. An organic light-emitting diode (OLED) touch display panel, comprising:
the OLED touch display substrate according to claim 1; and
a packaging cover plate arranged opposite to the OLED touch display substrate to form a cell.

6. The OLED touch display panel according to claim 5, wherein
within the display time period of the time period for displaying one image frame, the functional layer is capable of emitting white light under the effect of the cathode and the anode; and
a color filter is arranged on the packaging cover plate.

7. A display device, comprising the OLED touch display panel according to claim 5.

8. A method for controlling the display device according to claim 7, comprising:
within the display time period of the time period for displaying one image frame, applying a common voltage signal to the cathode and applying a data signal to the anode; and
within the touch time period of the time period for displaying one image frame, applying a touch scanning signal to touch signal lines and detecting whether or not a self-capacitance of each of the touch electrodes changes.

9. The method according to claim 8, wherein
the touch scanning signal is a square wave signal; and
the touch scanning signal is superimposed onto a signal applied to each of the signal lines of the OLED touch display substrate while applying the touch scanning signal to the touch signal lines.

10. An OLED touch display panel, comprising:
the OLED touch display substrate according to claim 2; and
a packaging cover plate arranged opposite to the OLED touch display substrate to form a cell.

11. The OLED touch display panel according to claim 10, wherein
within the display time period of the time period for displaying one image frame, the functional layer is capable of emitting white light under the effect of the cathode and the anode; and
a color filter is arranged on the packaging cover plate.

12. A display device, comprising the OLED touch display panel according to claim 10.

13. A method for controlling the display device according to claim 12, comprising:
within the display time period of the time period for displaying one image frame, applying a common voltage signal to the cathode and applying a data signal to the anode; and
within the touch time period of the time period for displaying one image frame, applying a touch scanning signal to touch signal lines and detecting whether or not a self-capacitance of each of the touch electrodes changes.

14. The method according to claim 13, wherein
the touch scanning signal is a square wave signal; and
the touch scanning signal is superimposed onto a signal applied to each of the signal lines of the OLED touch display substrate while applying the touch scanning signal to the touch signal lines.

15. An OLED touch display panel, comprising:
the OLED touch display substrate according to claim 3; and
a packaging cover plate arranged opposite to the OLED touch display substrate to form a cell.

16. The OLED touch display panel according to claim 15, wherein
within the display time period of the time period for displaying one image frame, the functional layer is capable of emitting white light under the effect of the cathode and the anode; and
a color filter is arranged on the packaging cover plate.

17. A display device, comprising the OLED touch display panel according to claim 15.

18. A method for controlling the display device according to claim 17, comprising:
within the display time period of the time period for displaying one image frame, applying a common voltage signal to the cathode and applying a data signal to the anode; and
within the touch time period of the time period for displaying one image frame, applying a touch scanning signal to touch signal lines and detecting whether or not a self-capacitance of each of the touch electrodes changes.

19. The method according to claim 18, wherein
the touch scanning signal is a square wave signal; and
the touch scanning signal is superimposed onto a signal applied to each of the signal lines of the OLED touch display substrate while applying the touch scanning signal to the touch signal lines.

20. An OLED touch display panel, comprising:
the OLED touch display substrate according to claim 4; and
a packaging cover plate arranged opposite to the OLED touch display substrate to form a cell.

* * * * *